(12) United States Patent
Yoon et al.

(10) Patent No.: US 10,998,043 B2
(45) Date of Patent: May 4, 2021

(54) NONVOLATILE MEMORY APPARATUS AND MEMORY SYSTEM USING THE SAME

(71) Applicant: SK hynix Inc., Icheon-si (KR)

(72) Inventors: Jung Hyuk Yoon, Anyang-si (KR); In Soo Lee, Seoul (KR)

(73) Assignee: SK hynix Inc., Icheon-si (KR)

(\*) Notice: Subject to any disclaimer, the term of this patent is extended or adjusted under 35 U.S.C. 154(b) by 0 days.

(21) Appl. No.: 16/774,773

(22) Filed: Jan. 28, 2020

(65) Prior Publication Data

US 2020/0402575 A1 Dec. 24, 2020

(30) Foreign Application Priority Data

Jun. 24, 2019 (KR) .......................... 10-2019-0074833

(51) Int. Cl.
*G11C 7/00* (2006.01)
*G11C 13/00* (2006.01)

(52) U.S. Cl.
CPC .......... *G11C 13/004* (2013.01); *G11C 13/003* (2013.01); *G11C 13/0004* (2013.01); *G11C 13/0026* (2013.01); *G11C 13/0028* (2013.01); *G11C 2013/0045* (2013.01); *G11C 2013/0052* (2013.01)

(58) Field of Classification Search
CPC ........... G11C 8/12; G11C 7/18; G11C 7/1006; G11C 7/10; G11C 7/1051; G11C 7/22; G11C 7/1072; G11C 7/1066
USPC .......................... 365/189.14, 189.15, 230.03
See application file for complete search history.

(56) References Cited

U.S. PATENT DOCUMENTS

| 8,139,399 | B2* | 3/2012 | Roy ..................... G11C 7/1015 365/149 |
| 9,659,621 | B2 | 5/2017 | Seo et al. |
| 2010/0034015 | A1* | 2/2010 | Tsuji ................... G11C 11/1673 365/158 |

* cited by examiner

*Primary Examiner* — Son T Dinh
(74) *Attorney, Agent, or Firm* — William Park & Associates Ltd.

(57) ABSTRACT

A nonvolatile memory apparatus includes a plurality of cell arrays, each including a near area and a far area. A plurality of memory cells are included in the near area, and a plurality of memory cells are included in the far area. When a memory cell of the plurality of memory cells, included in a near area of at least one cell array, among the plurality of cell arrays, is selected, based on an address signal, the nonvolatile memory apparatus selects memory cells included in far areas of the remaining cell arrays based on the address signal. The nonvolatile memory apparatus performs a first read operation on the selected memory cell of the at least one cell array, and performs a second read operation on the selected memory cells of the remaining cell arrays.

24 Claims, 7 Drawing Sheets

311

NONVOLATILE MEMORY APPARATUS AND MEMORY SYSTEM USING THE SAME

CROSS-REFERENCES TO RELATED APPLICATION

The present application claims priority under 35 U.S.C. § 119(a) to Korean application number 10-2019-0074833, filed on Jun. 24, 2019, in the Korean Intellectual Property Office, which is incorporated herein by reference in its entirety.

BACKGROUND

1. Technical Field

Various embodiments generally relate to a memory apparatus, and more particularly, to a nonvolatile memory apparatus and a memory system using the same.

2. Related Art

An electronic device may include many electronic components. Among the electronic components, a computer system may include a large number of electronic components composed of semiconductors. The computer system may include a memory apparatus. Since a dynamic random access memory (DRAM) can store and output data at high and constant speed and perform random access, the DRAM is widely used as a general memory apparatus. However, since the DRAM includes memory cells, each composed of a capacitor, the DRAM has a volatile characteristic of losing its stored data when the power supply is removed. In order to remove such disadvantages, a flash memory apparatus has been developed. The flash memory apparatus includes memory cells each composed of a floating gate, and thus, has a nonvolatile characteristic of retaining data stored therein, even though the power supply is removed. However, a flash memory apparatus stores and outputs data at lower speeds compared to a DRAM, and has difficulties in performing random access.

Recently, next-generation memory apparatuses, having high operation speed and nonvolatile characteristics, have been developed. Examples of the next-generation memory apparatuses may include a PCM (Phase Change Memory), a magnetic RAM, a resistive RAM, and a ferroelectric RAM. The next-generation memory apparatuses can operate at high speed while having nonvolatile characteristics. In particular, the PCM may include memory cells formed of chalcogenide and store data by changing the resistance values of the memory cells.

SUMMARY

In an embodiment, a nonvolatile memory apparatus may include a first cell array and a second cell array. The first cell array may include a near area and a far area. The second cell array may include a near area and a far area. When selecting a memory cell included in the near area of one of the two cell arrays based on an address signal, the nonvolatile memory apparatus may select a memory cell included in the far area of the remaining cell array based on the address signal. The nonvolatile memory apparatus may perform a first read operation on the memory cell, included in the near area of the one of the two cell arrays, and perform a second read operation on the memory cell, included in the far area of the remaining cell array. The first read operation may be performed for a longer period of time than the second read operation.

In an embodiment, a nonvolatile memory apparatus may include a first cell array, a first read control circuit, first read circuit, a second cell array, a second read control circuit, and a second read circuit. The first read control circuit may be configured to receive an address signal, generate a first scrambled address signal by scrambling the address signal through a first method, and output one of a first read pulse signal and a second read pulse signal based on the first scrambled address signal. The first read circuit may be configured to perform a read operation on the first cell array based on the output of the first read control circuit. The second read control circuit may be configured to receive the address signal, generate a second scrambled address signal by scrambling the address signal through a second method, different from the first method, and output one of the first and second read pulse signals based on the second scrambled address signal. The second read circuit may be configured to perform a read operation on the second cell array based on the output of the second read control circuit.

In an embodiment, a nonvolatile memory apparatus may include a plurality of cell arrays, each including a near area and a far area. A plurality of memory cells are included in the near area, and a plurality of memory cells are included in the far area. When a memory cell of the plurality of memory cells, included in a near area of one cell array, among the plurality of cell arrays, is selected, based on an address signal, the nonvolatile memory apparatus may select memory cells included in far areas of the remaining cell arrays based on the address signal. The nonvolatile memory apparatus may perform a first read operation on the selected memory cell of the one cell array, and perform a second read operation on the selected memory cells of the remaining cell arrays.

DETAILED DESCRIPTION

Figure 1:
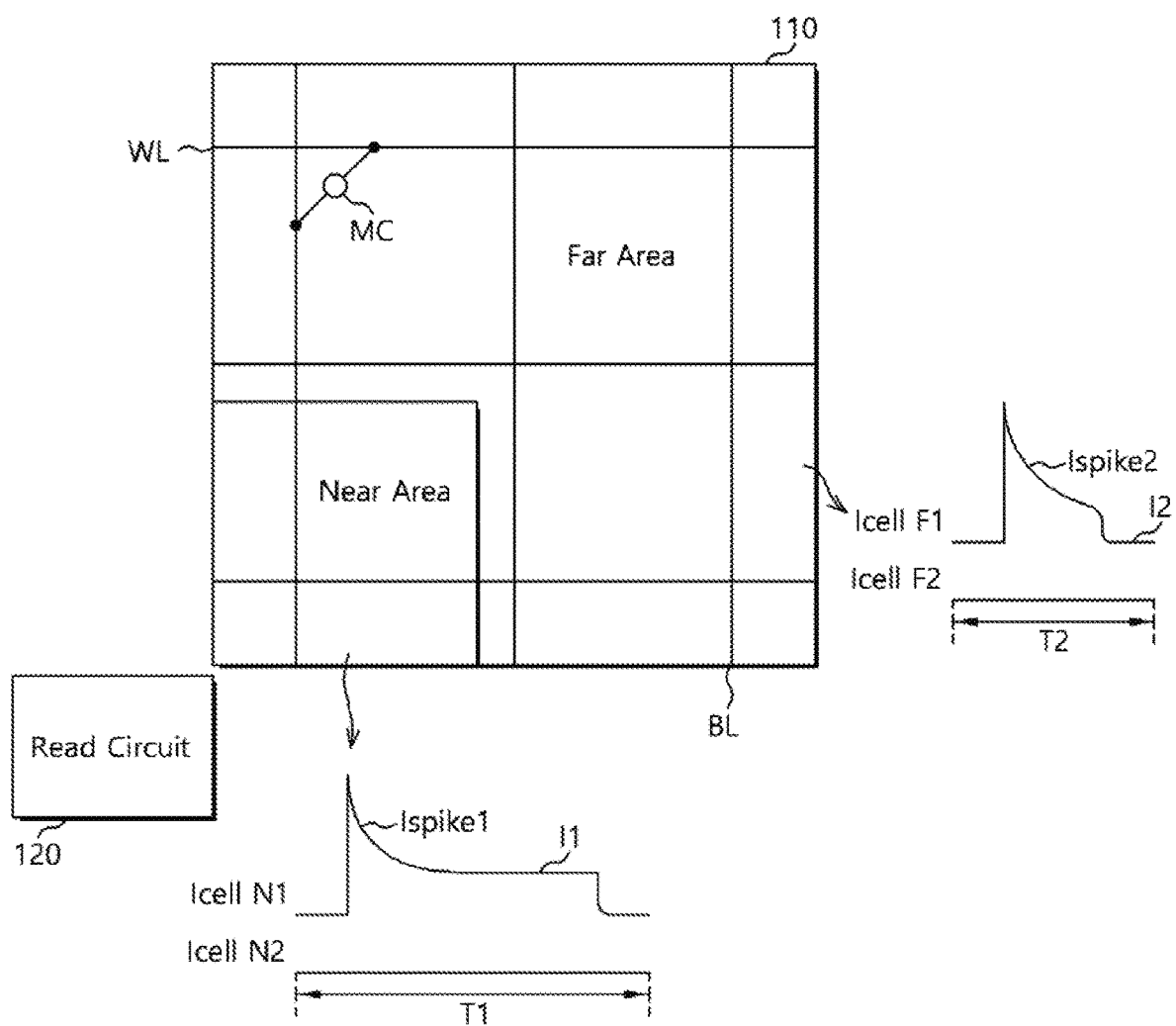
FIG. 1 is a diagram, illustrating a configuration and read operation of a nonvolatile memory apparatus, in accordance with an embodiment.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Since various modifications and changes may be applied to the embodiment according to the concept of the present disclosure and the embodiment according to the concept of the present disclosure may have various forms, the specific embodiments will be illustrated in the drawings and described in the present specification or application. However, it should be understood that the embodiment according to the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope according to the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~ between," "immediately ~ between" or "adjacent to ~", "directly adjacent to ~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

FIG. 1 illustrates a configuration and read operation of a nonvolatile memory apparatus 100, in accordance with an embodiment. Referring to FIG. 1, the nonvolatile memory apparatus 100 may include a cell array 110 and a read circuit 120. The cell array 110 may include a plurality of memory cells MC. In the cell array 110, a plurality of bit lines BL may be arranged, and a plurality of word lines WL may be arranged in a direction which is substantially orthogonal to the plurality of bit lines BL. The plurality of memory cells MC may be coupled to the respective intersections between the plurality of bit lines BL and the plurality of word lines WL. The cell array 110 may have a cross point array structure. The read circuit 120 may be coupled to the cell array 110, and perform a read operation on a memory cell, selected among the plurality of memory cells MC. The read circuit 120 may provide a read voltage to the selected memory cell, and read data, stored in the selected memory cell, based on whether snapback of the selected memory cell occurred.

The cell array 110 may include a near area and a far area. The near area may indicate an area, including a plurality of memory cells, which is disposed relatively near to the read circuit 120, and the far area may indicate an area, including a plurality of memory cells, which is disposed relatively far from the read circuit 120. Since the near area is disposed relatively near to the read circuit 120, a voltage and/or current, generated through the read circuit 120, may be reliably provided to the near area. However, since the far area is disposed relatively far from the read circuit 120, a voltage and/or current, generated through the read circuit 120, may be weaker due to the longer distance the voltage and/or current is required to travel to reach the far area from the read circuit 120. Therefore, read disturbance is more likely to occur in a memory cell, included in the near area, than in a memory cell, included in the far area. The read disturbance may indicate that data, stored in a memory cell, has been changed after a read operation is performed. For example, when the nonvolatile memory apparatus 100 includes phase-change memory cells, each formed of a phase-change material, the memory cell MC may be changed to either a low resistance state or a high resistance state in order to store data. The memory cell MC may be changed to the low resistance state to store set data or data 1. On the other hand, the memory cell MC may be changed to the high resistance state to store reset data or data 0. After a read operation is performed, the read disturbance may indicate that the resistance state of the memory cell MC is changed from the low resistance state to the high resistance state.

The nonvolatile memory apparatus 100 may perform a first read operation on a memory cell, included in the near area. The nonvolatile memory apparatus 100 may perform a second read operation on a memory cell, included in the far area. The first read operation may be performed for a longer period of time compared to the second read operation. For example, the first read operation may be performed during a first time T1, and the second read operation may be performed during a second time T2. The first time T1 may be longer than the second time T2. The first read operation may be performed by applying a read voltage and a first current I1 to a selected memory cell. The second read operation may be performed by applying the read voltage and a second current I2 to a selected memory cell. The first current I1 may be larger than the second current I2. The first current I1 may have an amount, corresponding to an anneal current and/or setback current, to set the resistance state of the selected memory cell to the low resistance state. The second current I2 may be a minimum sneak current, which can flow through the selected memory cell, after snapback of the selected memory cell has occurred.

<Memory Cell Current Icell N1 when First Read Operation is Performed on Memory Cell in Low Resistance State>

The first read operation on a memory cell included in the near area may be performed as follows. The read voltage and the first current I1 may be applied to the selected memory cell. Before the snapback of the selected memory cell occurs, no current may flow through the selected memory cell. When the snapback of the selected memory cell occurs, a spike current Ispike1 may flow through the selected memory cell. When the spike current Ispike1 decreases, the first current I1 may flow through the memory cell and set the resistance state of the memory cell to the low resistance state. The operation of applying the first current I1 to the memory cell may be a setback operation. As the first time T1 elapses, while the first current I1 is supplied for a sufficient time, the first read operation on the selected memory cell may end.

<Memory Cell Current Icell N2 when First Read Operation is Performed on Memory Cell in High Resistance State>

When the selected memory cell is in a high resistance state, the snapback of the selected memory cell might not occur even though the read voltage is applied to the selected memory cell. In this case, no current may flow through the selected memory cell. As the first time T1 elapses, the first read operation may end.

<Memory Cell Current Icell F1 when Second Read Operation is Performed on Memory Cell in Low Resistance State>

The second read operation on a memory cell, included in the far area, may be performed as follows. The read voltage and the second current I2 may be applied to the selected memory cell. Before the snapback of the selected memory cell occurs, no current may flow through the selected memory cell. When snapback of the selected memory cell occurs, a spike current Ispike2 may flow through the selected memory cell. When the spike current Ispike2 decreases, the second current I2 may flow through the selected memory cell. During the second read operation, no anneal current may be applied, and the setback operation might not be performed, unlike in the first read operation. As the second time T2 elapses, the second read operation may end.

<Memory Cell Current Icell F2 when Second Read Operation is Performed on Memory Cell in High Resistance State>

When the selected memory cell is in a high resistance state, the snapback of the selected memory cell might not occur even though the read voltage is applied to the selected memory cell. In this case, no current may flow through the selected memory cell. As the second time T2 elapses, the second read operation may end.

As such, when the first read operation is performed on a memory cell, included in the near area, read disturbance of the memory cell may be reduced. When the second read operation is performed on a memory cell included in the far area, power required for the read operation can be reduced.

Figure 2:
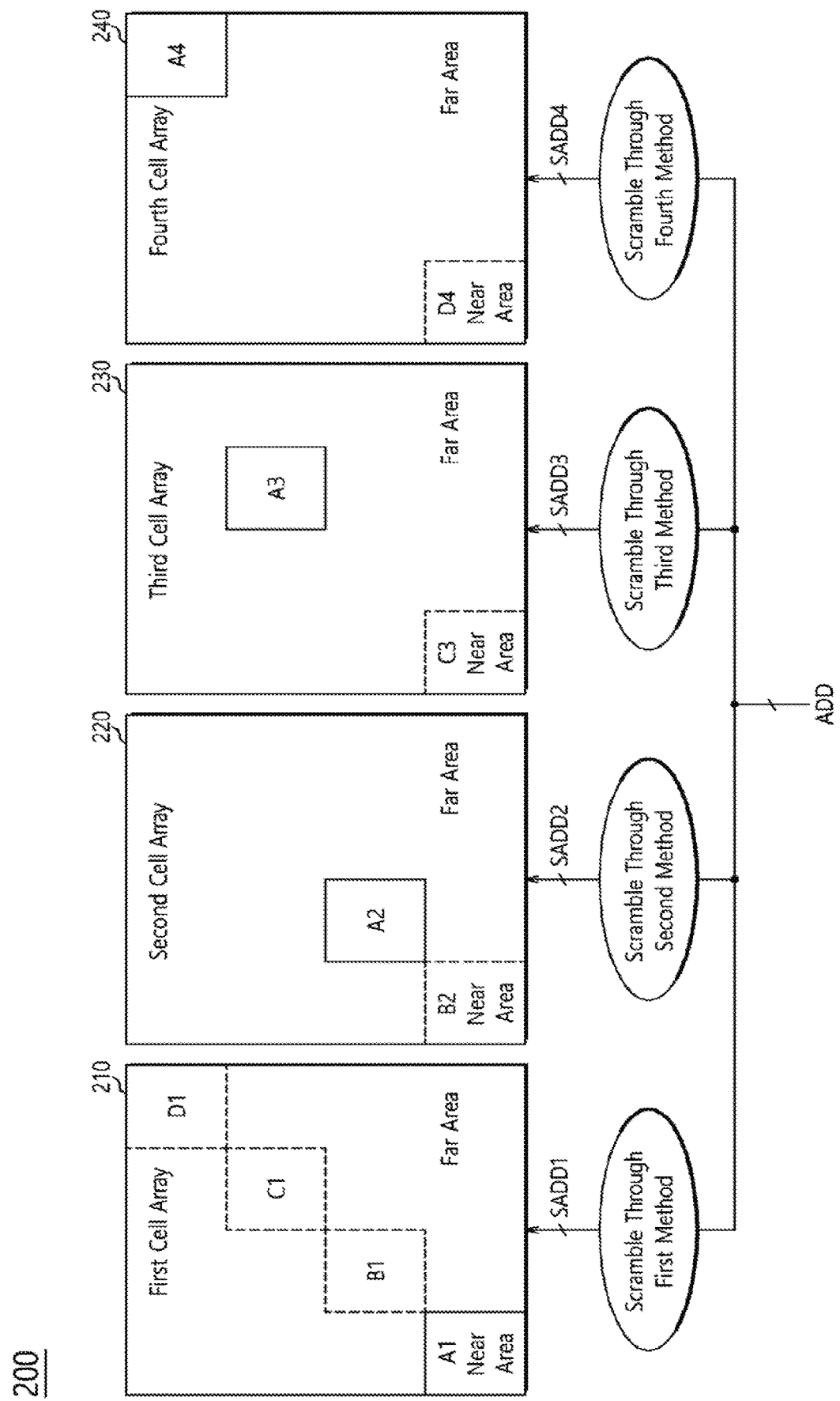
FIG. 2 is a diagram, illustrating a configuration of a nonvolatile memory apparatus, in accordance with an embodiment.

FIG. 2 illustrates a configuration of a nonvolatile memory apparatus 200, in accordance with an embodiment. Referring to FIG. 2, the nonvolatile memory apparatus 200 may include a plurality of cell arrays. FIG. 2 illustrates four cell arrays, but the number of the cell arrays may be smaller or larger than four. First to fourth cell arrays 210 to 240 may each include a near area and a far area. The nonvolatile memory apparatus 200 may select memory cells, included in the first to fourth cell arrays 210 to 240, based on an address signal ADD. The address signal ADD may include a plurality of bits. When a memory cell, included in the near area of at least one of the first to fourth cell arrays 210 to 240, is selected based on the address signal ADD, the nonvolatile memory apparatus 200 may select memory cells, included in the far areas of the remaining cell arrays, based on the address signal ADD. When a memory cell, included in the near area of at least one cell array, is selected, the nonvolatile memory apparatus 200 might not select memory cells, included in the near areas, of the other cell arrays. That is, the nonvolatile memory apparatus 200 might not select memory cells, included in the near areas, of multiple cell arrays, at the same time. In an embodiment, when a memory cell included in the near area of one of the first to fourth cell arrays 210 to 240 is selected based on the address signal ADD, the nonvolatile memory apparatus 200 may select memory cells included in the far areas of the remaining three cell arrays based on the address signal ADD as illustrated in FIG. 2.

The nonvolatile memory apparatus 200 may generate a plurality of scrambled address signals by scrambling the address signal ADD through different methods, and select memory cells of the plurality of cell arrays based on the plurality of scrambled address signals. Therefore, the nonvolatile memory apparatus 200 may select memory cells, included in different areas of the plurality of cell arrays, respectively, based on the same address signal.

The nonvolatile memory apparatus 200 may generate a first scrambled address signal SADD1, by scrambling the address signal ADD through a first method, and select a memory cell of the first cell array 210 based on the first scrambled address signal SADD1. The nonvolatile memory apparatus 200 may generate a second scrambled address signal SADD2, by scrambling the address signal ADD through a second method, and select a memory cell of the second cell array 220 based on the second scrambled address signal SADD2. The nonvolatile memory apparatus 200 may generate a third scrambled address signal SADD3, by scrambling the address signal ADD through a third method, and select a memory cell of the third cell array 230 based on the third scrambled address signal SADD3. The nonvolatile memory apparatus 200 may generate a fourth scrambled address signal SADD4, by scrambling the address signal ADD through a fourth method, and select a memory cell of the fourth cell array 240 based on the fourth scrambled address signal SADD4.

The first to fourth methods may be different from each other. For example, when a first address signal is inputted, the nonvolatile memory apparatus 200 may generate the first scrambled address signal SADD1, by scrambling the first address signal, through the first method, the first scrambled address signal SADD1 having information to select a memory cell, included in the near area A1 of the first cell array 210. For example, the first address signal may be an address signal having a first logic value. The nonvolatile memory apparatus 200 may generate the second scrambled address signal SADD2, by scrambling the first address signal, through the second method, different from the first method. The second scrambled address signal SADD2 may have information to select a memory cell, included in a first part A2 of the far area of the second cell array 220. The nonvolatile memory apparatus 200 may generate the third scrambled address signal SADD3, by scrambling the first address signal, through the third method, different from the first and second methods. The third scrambled address signal SADD3 may have information to select a memory cell, included in a second part A3 of the far area of the third cell array 230. The nonvolatile memory apparatus 200 may generate the fourth scrambled address signal SADD4, by scrambling the first address signal, through the fourth method, different from the first to third methods. The fourth scrambled address signal SADD4 may have information to select a memory cell, included in a third part A4 of the far area of the fourth cell array 240.

When a second address signal is inputted, the nonvolatile memory apparatus 200 may generate the second scrambled address signal SADD2, by scrambling the second address signal, through the second method, the second scrambled address signal SADD2 having information to select a memory cell, included in the near area B2 of the second cell array 220. For example, the second address signal may be an address signal having a second logic value. The nonvolatile memory apparatus 200 may generate the first scrambled address signal SADD1, by scrambling the second address signal, through the first method, and the first scrambled address signal SADD1 may have information to select a memory cell included, in a first part B1 of the far area of the first cell array 210, for example.

The nonvolatile memory apparatus 200 may generate the third scrambled address signal SADD3, by scrambling the second address signal, through the third method, and the third scrambled address signal SADD3 may have information to select a memory cell, included in the far area of the third cell array 230. The nonvolatile memory apparatus 200 may generate the fourth scrambled address signal SADD4, by scrambling the second address signal, through the fourth method, and the fourth scrambled address signal SADD4 may have information to select a memory cell, included in the far area of the fourth cell array 240.

When a third address signal is inputted, the nonvolatile memory apparatus 200 may generate the third scrambled address signal SADD3, by scrambling the third address signal, through the third method, the third scrambled address signal SADD3 having information to select a memory cell, included in the near area C3 of the third cell array 230. For example, the third address signal may be an address signal having a third logic value. The nonvolatile memory apparatus 200 may generate the first scrambled address signal SADD1, by scrambling the third address signal, through the first method, and the first scrambled address signal SADD1 may have information to select a memory cell, included in a second part C1 of the far area of the first cell array 210, for example. The nonvolatile memory apparatus 200 may generate the second scrambled address signal SADD2, by scrambling the third address signal, through the second method, and the second scrambled address signal SADD2 may have information to select a memory cell, included in the far area of the second cell array 220. The nonvolatile memory apparatus 200 may generate the fourth scrambled address signal SADD4, by scrambling the third address signal, through the fourth method, and the fourth scrambled address signal SADD4 may have information to select a memory cell, included in the far area of the fourth cell array 240.

When a fourth address signal is inputted, the nonvolatile memory apparatus 200 may generate the fourth scrambled address signal SADD4, by scrambling the fourth address signal, through the fourth method, the fourth scrambled address signal SADD4 having information to select a memory cell, included in the near area D4 of the fourth cell array 240. For example, the fourth address signal may be an address signal having a fourth logic value. The nonvolatile memory apparatus 200 may generate the first scrambled address signal SADD1, by scrambling the fourth address signal, through the first method, and the first scrambled address signal SADD1 may have information to select a memory cell, included in a third part D1 of the far area of the first cell array 210, for example. The nonvolatile memory apparatus 200 may generate the second scrambled address signal SADD2, by scrambling the fourth address signal, through the second method, and the second scrambled address signal SADD2 may have information to select a memory cell, included in the far area of the second cell array 220. The nonvolatile memory apparatus 200 may generate the third scrambled address signal SADD3, by scrambling the fourth address signal, through the third method, and the third scrambled address signal SADD3 may have information to select a memory cell, included in the far area of the third cell array 230.

Figure 3:
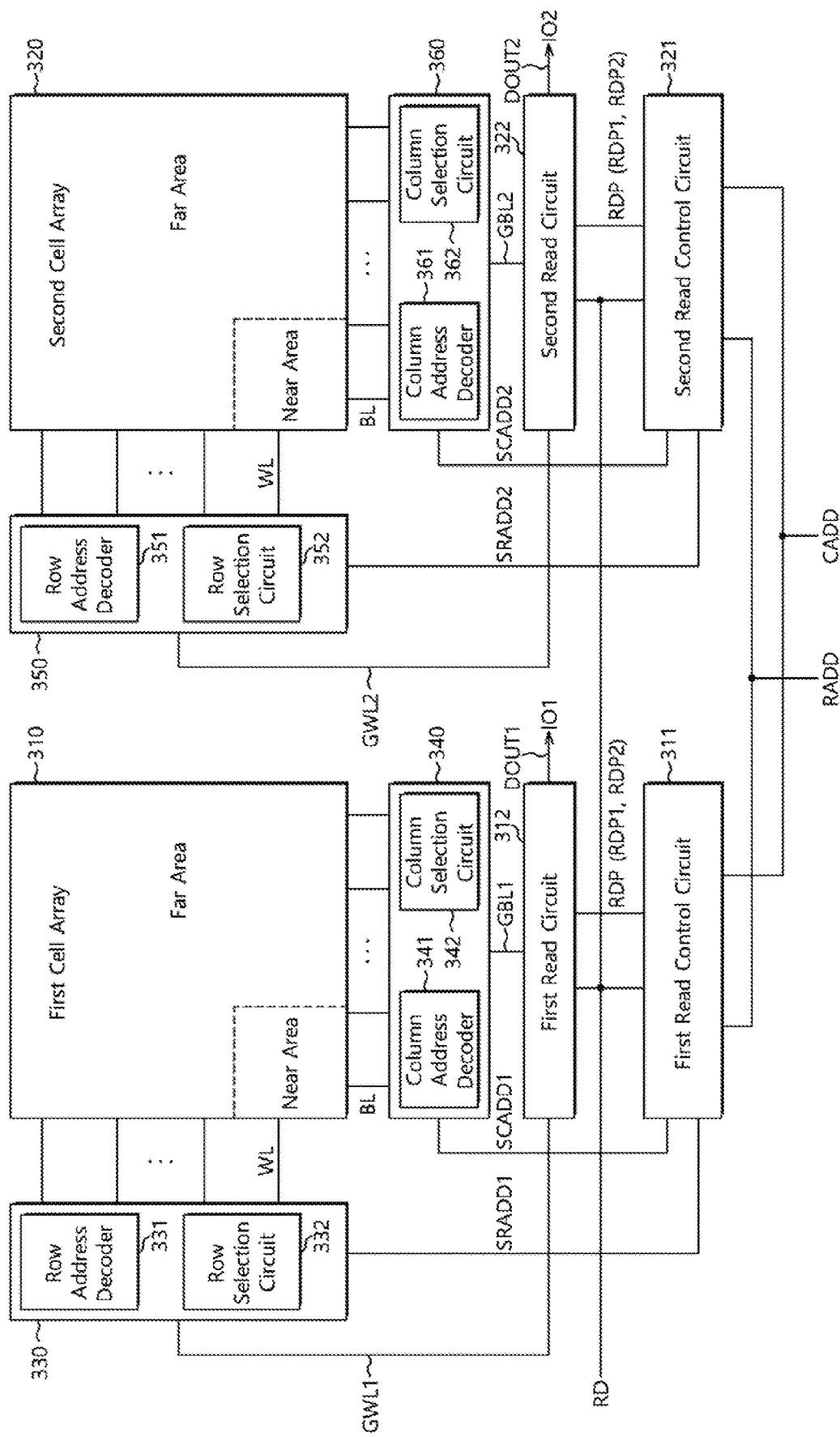
FIG. 3 is a diagram, illustrating a configuration of a nonvolatile memory apparatus, in accordance with an embodiment.

FIG. 3 illustrates a configuration of a nonvolatile memory apparatus 300, in accordance with an embodiment. For clear description, FIG. 3 illustrates two cell arrays and circuits for performing a read operation on the two cell arrays. Referring to FIG. 3, the nonvolatile memory apparatus 300 may include a first cell array 310, a first read control circuit 311, a first read circuit 312, a second cell array 320, a second read control circuit 321 and a second read circuit 322. The first cell array 310 and the second cell array 320 may include a plurality of memory cells, each formed of a phase-change material. Each of the first and second cell arrays 310 and 320 may include a plurality of bit lines BL and a plurality of word lines WL, arranged therein, and the plurality of memory cells may be coupled to the respective intersections between the plurality of word lines WL and the plurality of bit lines BL. Each of the first and second cell arrays 310 and 320 may include a near area and a far area. The near area may indicate an area of the first or second cell array 310 or 320, including memory cells, disposed relatively near to the first or second read circuit 312 or 322, respectively. The far area may indicate an area of the first or second cell array 310 or 320, including memory cells, disposed relatively far from first or second read circuit 312 or 322, respectively.

The first and second read control circuits 311 and 321 may receive a read signal RD and an address signal, in common. The address signal may include a row address signal RADD and a column address signal CADD. Each of the row address signal RADD and the column address signal CADD may include a plurality of bits. The row address signal RADD may be applied to select a specific word line, among the plurality of word lines WL, of the first and second cell arrays 310 and 320. The column address signal CADD may be applied to select a specific bit line, among the plurality of bit lines BL, of the first and second cell arrays 310 and 320. The first read control circuit 311 may generate a read pulse signal RDP based on the read signal RD. The first read control circuit 311 may generate a first scrambled address signal, by scrambling the address signal RADD/CADD, through a first method. The first scrambled address signal may include a first scrambled row address signal SRADD1 and a first scrambled column address signal SCADD1. Each of the first scrambled row address signal SRADD1 and the first scrambled column address signal SCADD1 may include a plurality of bits.

The first read control circuit 311 may adjust the pulse width of the read pulse signal RDP based on the first scrambled address signals SRADD1 and SCADD1. For example, in order to change the pulse width of the read pulse signal RDP, the first read control circuit 311 may output one of first and second read pulse signals RDP1 and RDP2 as the read pulse signal RDP based on the first scrambled address signals SRADD1 and SCADD1. The first read control circuit 311 may generate the first read pulse signal RDP1 and the second read pulse signal RDP2 based on the read signal RD. The first read pulse signal RDP1 may be enabled for a longer period of time than the second read pulse signal RDP2. For example, when the first scrambled address signals SRADD1 and SCADD1 have information to select a memory cell, included in the near area of the first cell array 310, the first read control circuit 311 may output the first read pulse signal RDP1 as the read pulse signal RDP. When the first scrambled address signals SRADD1 and SCADD1 have information to select a memory cell, included in the far area of the first cell array 310, the first read control circuit 311 may output the second read pulse signal RDP2 as the read pulse signal RDP.

The first read circuit 312 may receive the read signal RD and the read pulse signal RDP and perform a read operation. The first read circuit 312 may perform one of the first and second read operations based on the read signal RD and the read pulse signal RDP. When receiving the first read pulse signal RDP1 as the read pulse signal RDP, the first read circuit 312 may perform the first read operation on the selected memory cell. During the first read operation, the first read circuit 312 may apply a read voltage and a first current to the selected memory cell, during a first time, based on the first read pulse signal RDP1. When receiving the second read pulse signal RDP2 as the read pulse signal RDP, the first read circuit 312 may perform the second read operation on the selected memory cell. During the second read operation, the first read circuit 312 may apply the read voltage and a second current to the selected memory cell, during a second time, based on the second read pulse signal RDP2. The first read circuit 312 may read data stored in the selected memory cell, and generate a first data output signal DOUT1. For example, the first read circuit 312 may read the data stored in the selected memory cell by detecting the resistance state and/or threshold voltage of the selected memory cell based on the read signal RD. The first data output signal DOUT1 may be transmitted through a first data transmission line 101.

The nonvolatile memory apparatus 300 may further include a first row selection block 330 and a first column selection block 340. The first row selection block 330 may select a specific word line among the plurality of word lines WL of the first cell array 310, based on the first scrambled row address signal SRADD1. The first row selection block 330 may include a row address decoder 331 and a row selection circuit 332. The row address decoder 331 may receive the first scrambled row address signal SRADD1 and decode the first scrambled row address signal SRADD1. The row selection circuit 332 may couple one of the plurality of word lines WL to a first global word line GWL1 based on the decoded signal. The first column selection block 340 may select a specific bit line among the plurality of bit lines BL of the first cell array 310, based on the first scrambled column address signal SCADD1. The first column selection block 340 may include a column address decoder 341 and a column selection circuit 342. The column address decoder 341 may receive the first scrambled column address signal SCADD1 and decode the first scrambled column address signal SCADD1. The column selection circuit 342 may couple one of the plurality of bit lines BL to a first global bit line GBL1 based on the decoded signal.

The first read circuit 312 may be coupled to the first global bit line GBL1 and the first global word line GWL1. When a specific bit line and a specific word line are selected, based on the first scrambled address signals SRADD1 and SCADD1, a specific memory cell may be selected. The first read circuit 312 may be coupled to the selected memory cell through the first global bit line GBL1 and the first global word line GWL1 and may perform a read operation on the selected memory cell.

The second read control circuit 321 may receive the read signal RD and the address signal RADD/CADD. The second read control circuit 321 may generate a second scrambled address signal by scrambling the address signal RADD/CADD through a second method. The second scrambled address signal may include a second scrambled row address signal SRADD2 and a second scrambled column address signal SCADD2. Each of the second scrambled row address signal SRADD2 and the second scrambled column address signal SCADD2 may include a plurality of bits. The second read control circuit 321 may output one of the first and second read pulse signals RDP1 and RDP2 as the read pulse signal RDP based on the second scrambled address signals SRADD2 and SCADD2. The second read control circuit 321 may perform substantially the same function and operation as the first read control circuit 311, except for the fact that the second read control circuit 321 scrambles the address signal RADD/CADD through the second method. For example, when the second scrambled address signals SRADD2 and SCADD2 have information to select a memory cell, included in the near area of the second cell array 320, the second read control circuit 321 may output the first read pulse signal RDP1 as the read pulse signal RDP. When the second scrambled address signals SRADD2 and SCADD2 have information to select a memory cell, included in the far area of the second cell array 320, the second read control circuit 321 may output the second read pulse signal RDP2 as the read pulse signal RDP.

The second read circuit 322 may receive the read signal RD and the read pulse signal RDP and perform a read operation. The second read circuit 322 may perform one of the first and second read operations based on the read signal RD and the read pulse signal RDP. When receiving the first read pulse signal RDP1 as the read pulse signal RDP, the second read circuit 322 may perform the first read operation on the selected memory cell. During the first read operation, the second read circuit 322 may apply the read voltage and the first current to the selected memory cell during the first time, based on the first read pulse signal RDP1. When receiving the second read pulse signal RDP2 as the read pulse signal RDP, the second read circuit 322 may perform the second read operation on the selected memory cell. During the second read operation, the second read circuit 322 may apply the read voltage and the second current to the selected memory cell during the second time, based on the second read pulse signal RDP2. The second read circuit 322 may read data stored in the selected memory cell, and generate a second data output signal DOUT2. For example, the second read circuit 322 may read the data stored in the selected memory cell by detecting the resistance state and/or threshold voltage of the selected memory cell based on the read signal RD. The second data output signal DOUT2 may be transmitted through a second data transmission line 102. The signals, transmitted through the first and second data transmission lines 101 and 102, may be outputted to an external device coupled to the nonvolatile memory apparatus 300 through different data channels.

The nonvolatile memory apparatus 300 may further include a second row selection block 350 and a second column selection block 360. The second row selection block 350 may select a specific word line among the plurality of word lines WL of the second cell array 320, based on the second scrambled row address signal SRADD2. The second row selection block 350 may include a row address decoder 351 and a row selection circuit 352. The row address decoder 351 may receive the second scrambled row address signal SRADD2 and decode the second scrambled row address signal SRADD2. The row selection circuit 352 may couple one of the plurality of word lines WL to a second global word line GWL2 based on the decoded signal. The second column selection block 360 may select a specific bit line among the plurality of bit lines BL of the second cell array 320, based on the second scrambled column address signal SCADD2. The second column selection block 360 may include a column address decoder 361 and a column selection circuit 362. The column address decoder 361 may receive the second scrambled column address signal SCADD2 and decode the second scrambled column address signal SCADD2. The column selection circuit 362 may couple one of the plurality of bit lines BL to a second global bit line GBL2 based on the decoded signal.

The second read circuit 322 may be coupled to the second global bit line GBL2 and the second global word line GWL2. When a specific bit line and a specific word line are selected, based on the second scrambled address signals SRADD2 and SCADD2, a specific memory cell may be selected. The second read circuit 322 may be coupled to the selected memory cell through the second global bit line GBL2 and the second global word line GWL2 and may perform a read operation on the selected memory cell.

Figure 4:
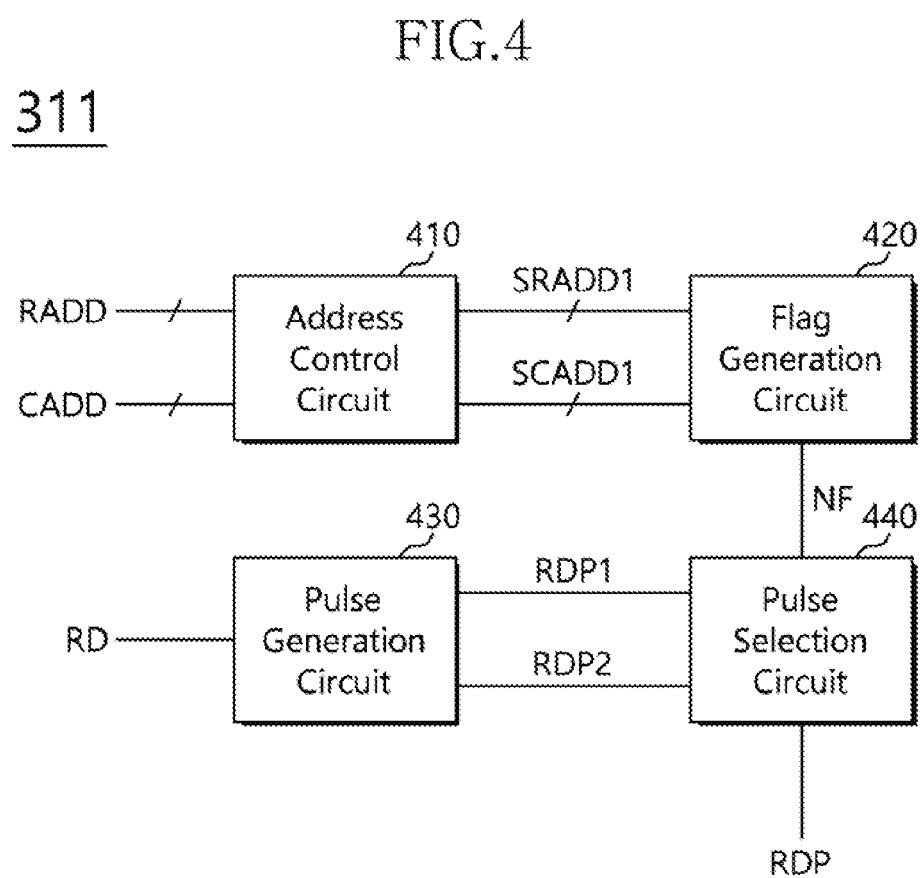
FIG. 4 is a diagram, illustrating a configuration of a first read control circuit, illustrated in FIG. 3.

FIG. 4 illustrates the configuration of the first read control circuit 311, illustrated in FIG. 3. The first read control circuit 311 may include an address control circuit 410, a flag generation circuit 420, a pulse generation circuit 430 and a pulse selection circuit 440. The address control circuit 410 may receive the address signals RADD and CADD, and generate the first scrambled address signals SRADD1 and SCADD1. The address control circuit 410 may generate the first scrambled row address signal SRADD1 and the first scrambled column address signal SCADD1, by scrambling the row address signal RADD and the column address signal CADD, through the first method. The flag generation circuit 420 may generate a flag signal NF based on the first scrambled address signals SRADD1 and SCADD1. The flag generation circuit 420 may enable the flag signal NF when the first scrambled row address signal SRADD1 and the first scrambled column address signal SCADD1 have information to select a memory cell, included in the near area of the first cell array 310, illustrated in FIG. 3. The flag generation circuit 420 may disable the flag signal NF when the first scrambled row address signal SRADD1 and the first scrambled column address signal SCADD1 have information to select a memory cell, included in the far area of the first cell array 310. For example, based on the logic levels of specific bits of the first scrambled address signals SRADD1 and SCADD1, the flag generation circuit 420 may determine whether the first scrambled address signals SRADD1 and SCADD1 have information to select a memory cell, included in the near area, or information to select a memory cell, included in the far area.

The pulse generation circuit 430 may receive the read signal RD. The pulse generation circuit 430 may generate the first read pulse signal RDP1 and the second read pulse signal RDP2 based on the read signal RD. In an embodiment, in order to adjust the pulse width of the read pulse signal RDP in various manners, the pulse generation circuit 430 may be modified to generate a read pulse signal having three or more different pulse widths. The pulse selection circuit 440 may receive the first and second read pulse signals RDP1 and RDP2 from the pulse generation circuit 430 and may receive the flag signal NF from the flag generation circuit 420. The pulse selection circuit 440 may output one of the first and second read pulse signals RDP1 and RDP2 as the read pulse signal RDP, based on the flag signal NF. The second read control circuit 321, illustrated in FIG. 3, may have substantially the same configuration as the first read control circuit 311, illustrated in FIG. 4, except for the fact that the second read control circuit 321 generates the second scrambled address signals SRADD2 and SCADD2 by scrambling the address signals RADD and CADD through the second method. In an embodiment, the pulse generation circuit 430 may be installed in both or any one of the first and second read control circuits 311 and 321. The pulse generation circuit 430 may be separately installed outside the first and second read control circuits 311 and 321 and may provide the first and second read pulse signals RDP1 and RDP2 to the first and second read control circuits 311 and 321, in common.

Figure 5:
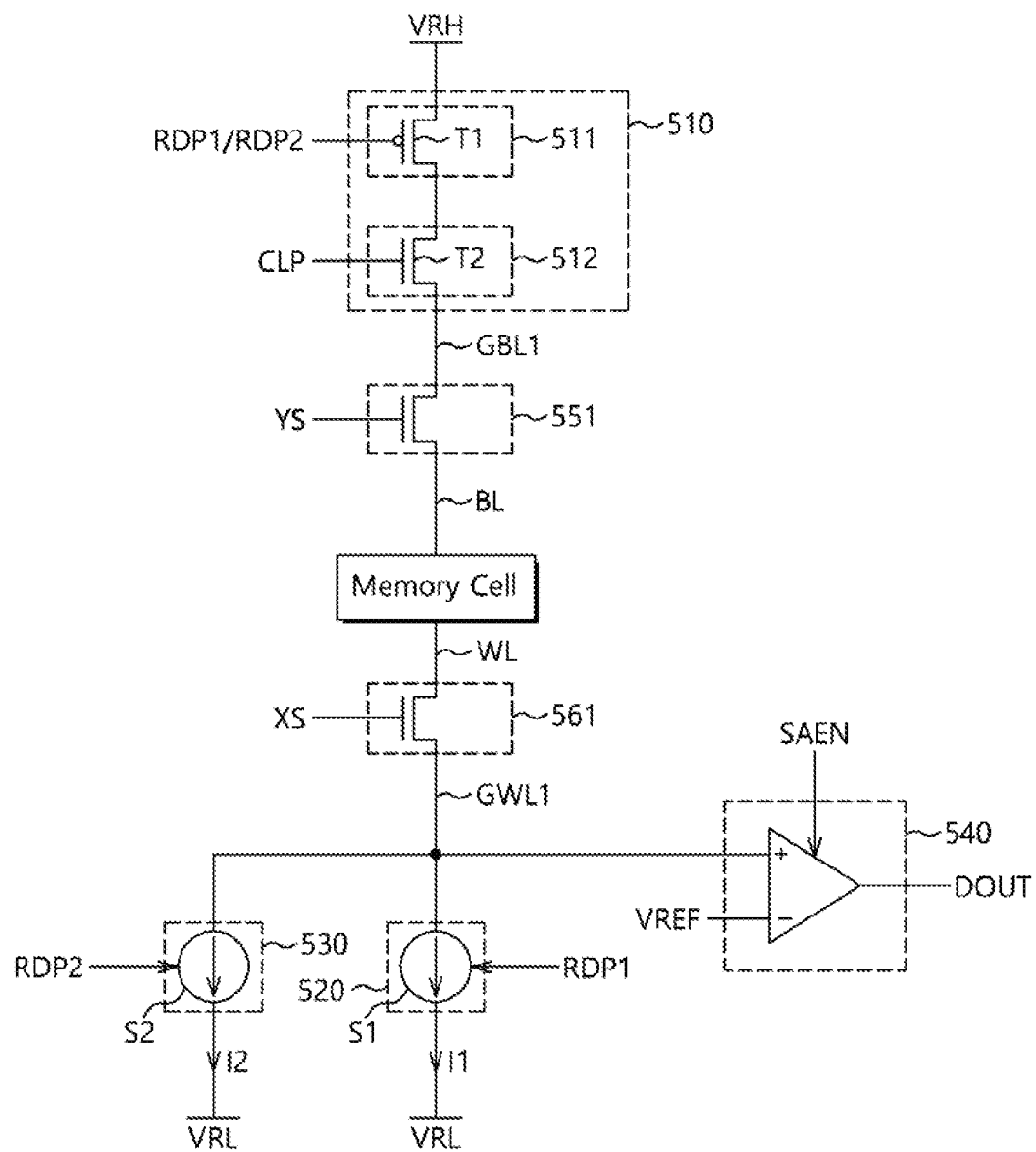
FIG. 5 is a diagram, illustrating a configuration of a first read circuit, illustrated in FIG. 3, and a coupling relationship between a first cell array and the first read circuit.

FIG. 5 illustrates the configuration of a read circuit, in accordance with an embodiment, and a coupling relationship between the read circuit and a cell array. The configuration, illustrated in FIG. 5, may be applied as one or more of the coupling relationship between the first read circuit 312 and the first cell array 310 and the coupling relationship between the second read circuit 322 and the second cell array 320, in FIG. 3. Referring to FIG. 5, the read circuit may include a voltage supply circuit 510, a first current supply circuit 520, a second current supply circuit 530 and a sense amplifier 540. The voltage supply circuit 510 may be coupled to the first global bit line GBL1. The voltage supply circuit 510 may provide a first read voltage to the first global bit line GBL1 based on the read pulse signal (i.e. the first or second read pulse signal RDP1 or RDP2). The first global bit line GBL1 may be coupled to a bit line BL, to which a selected memory cell is coupled, through a column selection switch 551. The column selection switch 551 may be a component of the column selection circuit 342, illustrated in FIG. 3. The column selection switch 551 may couple the first global bit line GBL1 to the bit line BL based on a column selection signal YS. The column selection signal YS may be obtained by decoding the first scrambled column address signal SCADD1, through the column address decoder 341, illustrated in FIG. 3.

The first and second current supply circuits 520 and 530 may be coupled to the first global word line GWL1 and supply a second read voltage to the first global word line GWL1. A voltage level difference, between the first and second read voltages, may correspond to the voltage level of the read voltage to read data, stored in the memory cell. The first current supply circuit 520 may receive the first read pulse signal RDP1, provide the second read voltage to the first global word line GWL1 based on the first read pulse signal RDP1, and cause the first current I1 to flow through the first global word line GWL1. The second current supply circuit 530 may receive the second read pulse signal RDP2, provide the second read voltage to the first global word line GWL1 based on the second read pulse signal RDP2, and cause the second current I2 to flow through the first global word line GWL1. The first global word line GWL1 may be coupled to a word line WL, to which the selected memory cell is coupled, through a row selection switch 561. The row selection switch 561 may be a component of the row selection circuit 332, illustrated in FIG. 3. The row selection switch 561 may couple the first global word line GWL1 to the word line WL based on a row selection signal XS. The row selection signal XS may be obtained by decoding the first scrambled row address signal SRADD1, through the row address decoder 331, illustrated in FIG. 3.

The sense amplifier 540 may sense whether a snapback of the memory cell occurs, and generate the first data output signal DOUT1. The sense amplifier 540 may be coupled to the first global word line GWL1. The sense amplifier 540 may generate the first data output signal DOUT1 by sensing a change in the voltage level of the first global word line GWL1 based on the resistance state and/or the threshold voltage of the memory cell. The sense amplifier 540 may generate the first data output signal DOUT1 by comparing the voltage level of the global word line GWL1 to a reference voltage VREF based on a sensing enable signal SAEN. The sensing enable signal SAEN may be generated based on the read signal RD. The sensing enable signal SAEN may be enabled when a sufficient time elapses until the snapback of the memory cell occurs after the read voltage is applied to the memory cell. The sensing enable signal SAEN may be generated by delaying the read signal RD. When the snapback of the memory cell occurs, the reference voltage VREF may have a voltage level, suitable for sensing a change in voltage level of the first global word line GWL1. In an embodiment, the voltage supply circuit 510 may be modified in such a manner that the voltage supply circuit 510 coupled to the first global word line GWL1 to supply the second read voltage to the first global word line GWL1. The first and second current supply circuits 520 and 530 may be modified in such a manner that the first and second current supply circuits 520 and 530 are coupled to the first global bit line GBL1, to supply the first read voltage to the first global bit line GBL1, and cause the first or second current I1 or I2 to flow through the first global bit line GBL1. The sense amplifier 540 may be modified in such a manner that the sense amplifier 540 is coupled to the first global bit line GBL1 to sense a change in voltage level of the first global bit line GBL1.

The voltage supply circuit 510 may include a voltage driver 511 and a clamping circuit 512. The voltage driver 511 may output a first supply voltage VRH based on the read pulse signal (i.e. the first or second read pulse signal RDP1 or RDP2). The clamping circuit 512 may clamp the voltage level of the first supply voltage VRH, provided from the voltage driver 511, based on a clamping signal CLP. For example, the clamping circuit 512 may generate the first read voltage by lowering the voltage level of the first supply voltage VRH. The clamping signal CLP may be a bias voltage, which is generated based on the read signal RD.

The voltage driver 511 may include a first transistor T1. The first transistor T1 may include a P-channel MOS transistor. The first transistor T1 may have a gate configured to receive the read pulse signal (i.e. the first or second read pulse signal RDP1 or RDP2) and a source coupled to a terminal to which the first supply voltage VRH is supplied. The clamping circuit 512 may include a second transistor T2. The second transistor T2 may be an N-channel MOS transistor. The second transistor T2 may have a gate configured to receive the clamping signal CLP, a drain coupled to a drain of the first transistor T1, and a source coupled to the first global bit line GBL1.

The first current supply circuit 520 may include a first current source S1. The first current source S1 may be coupled between the first global word line GWL1 and a terminal to which a second supply voltage VRL is supplied. The voltage level of the second supply voltage VRL may correspond to the voltage level of the second read voltage, and the second supply voltage VRL may have a lower voltage level than the first supply voltage VRH. The first current source S1 may receive the first read pulse signal RDP1, provide the second supply voltage VRL to the first global word line GWL1 based on the first read pulse signal RDP1, and cause the first current I1 to flow through the first global word line GWL1. The second current supply circuit 530 may include a second current source S2. The second current source S2 may be coupled between the first global word line GWL1 and a terminal to which the second supply voltage VRL is supplied. The second current source S2 may receive the second read pulse signal RDP2, provide the second supply voltage VRL to the first global word line GWL1 based on the second read pulse signal RDP2, and cause the second current I2 to flow through the first global word line GWL1. The second read circuit 522 illustrated in FIG. 3 may have substantially the same configuration as the first read circuit 312, illustrated in FIG. 5, except that the second read circuit 522 is coupled to the second global bit line GBL2 and the second global word line GWL2 and outputs the second data output signal DOUT2.

Referring to FIGS. 3 to 5, the operation of the nonvolatile memory apparatus 300 in accordance with the present embodiment will be described as follows. In order to read data stored in the first and second cell arrays 310 and 320, the address signals RADD and CADD may be inputted. The first and second read control circuits 311 and 321 may receive the address signals RADD and CADD in common. The address control circuit 410 of the first read control circuit 311 may generate the first scrambled address signals SRADD1 and SCADD1 by scrambling the address signals RADD and CADD through the first method, and the address control circuit of the second read control circuit 321 may generate the second scrambled address signals SRADD2 and SCADD2 by scrambling the address signals RADD and CADD through the second method. Since the first and second read control circuits 311 and 321 scramble the address signals RADD and CADD through different methods, memory cells included in the near areas of the first and second cell arrays 310 and 320 may be controlled not to be selected at the same time by the first scrambled address signals SRADD1 and SCADD1 and the second scrambled address signals SRADD2 and SCADD2. For example, when the first scrambled address signals SRADD1 and SCADD1 have information capable of selecting a memory cell included in the near area of the first cell array 310, the second scrambled address signals SRADD2 and SCADD2 may have information to select a memory cell included in the far area of the second cell array 320. On the contrary, when the second scrambled address signals SRADD2 and SCADD2 have information capable of selecting a memory cell included in the near area of the second cell array 320, the first scrambled address signals SRADD1 and SCADD1 may have information to select a memory cell included in the far area of the first cell array 310.

Hereafter, the case in which a memory cell included in the near area of the first cell array 310 is selected based on the first scrambled address signals SRADD1 and SCADD1 will be described. The flag generation circuit 420 of the first read control circuit 311 may enable the flag signal NF based on the first scrambled address signals SRADD1 and SCADD1. The pulse selection circuit 440 may output the first read pulse signal RDP1 based on the flag signal NF. The first read circuit 312 may perform the first read operation on the memory cell selected based on the first scrambled address signals SRADD1 and SCADD1, based on the first read pulse signal RDP1 and the read signal RD. The voltage supply circuit 510 may provide the first read voltage through the first global bit line GBL1 based on the first read pulse signal RDP1. The first current supply circuit 520 may provide the second read voltage to the first global word line GWL1 based on the first read pulse signal RDP1, and cause the first current I1 to flow through the first global word line GWL1. Therefore, a read voltage may be applied across the memory cell. When the selected memory cell is in the high resistance state, the selected memory cell might not be turned on even though the read voltage is applied, and snapback of the selected memory cell might not occur. Therefore, no current may flow through the selected memory cell. The sense amplifier 540 may sense that the voltage level of the first global word line GWL1 is not changed, and generate the first data output signal DOUT1 having a logic low level. When the selected memory cell is in the low resistance state, the selected memory cell may be turned on, and snapback of the selected memory cell may occur. When the snapback occurs, a spike current may flow through the selected memory cell. When the spike current flows through the selected memory cell, the voltage level of the first global word line GWL1 may rise. Therefore, the sense amplifier 540 may sense a change in voltage level of the first global word line GWL1, and generate the first data output signal DOUT1 having a logic high level. When the spike current decreases, the first current I1 may flow through the selected memory cell. The first current I1 may be applied to the selected memory cell for a sufficient time, and set the selected memory cell in the low resistance state.

The second read control circuit 321 may disable the flag signal NF based on the second scrambled address signals SRADD2 and SCADD2. The pulse selection circuit of the second read control circuit 321 may output the second read pulse signal RDP2 based on the flag signal. The second read circuit 322 may perform the second read operation on the memory cell selected based on the second scrambled address signals SRADD2 and SCADD2, based on the second read pulse signal RDP2 and the read signal RD. The voltage supply circuit of the second read circuit 322 may provide the first read voltage through the second global bit line GBL2 based on the second read pulse signal RDP2. The second current supply circuit of the second read circuit 322 may provide the second read voltage to the second global word line GWL2 based on the second read pulse signal RDP2, and cause the second current I2 to flow through the second global word line GWL2. Therefore, a read voltage may be applied across the memory cell. When the selected memory cell is in the high resistance state, the selected memory cell might not be turned on even though the read voltage is applied, and snapback of the selected memory cell might not occur. Therefore, no current may flow through the selected memory cell. The sense amplifier of the second read circuit 322 may sense that the voltage level of the second global word line GWL2 is not changed, and generate the second data output signal DOUT2 having a logic low level. When the selected memory cell is in the low resistance state, the selected memory cell may be turned on, and snapback of the selected memory cell may occur. When the snapback occurs, a spike current may flow through the selected memory cell. When the spike current flows through the selected memory cell, the voltage level of the second global word line GWL2 may rise. Therefore, the sense amplifier may sense a change in voltage level of the second global word line GWL2, and generate the second data output signal DOUT2 having a logic high level. When the spike current decreases, the second current I2 may flow through the selected memory cell, and the second read operation may end soon.

The nonvolatile memory apparatus in accordance with the present embodiment may reduce read disturbance of the memory cell by performing the first read operation, when a memory cell included in the near area of the cell array is selected. Furthermore, when a memory cell included in the far area of the cell array is selected, the nonvolatile memory apparatus may perform the second read operation to reduce power consumed for the read operation. When a memory cell included in the near area of at least one cell array among the plurality of cell arrays is selected, the nonvolatile memory apparatus may select memory cells included in the far areas of the other cell arrays, thereby minimizing the number of cell arrays where the first read operation is performed. Therefore, the nonvolatile memory apparatus can minimize power consumed for the read operation while effectively reducing read disturbance.

Figure 6:
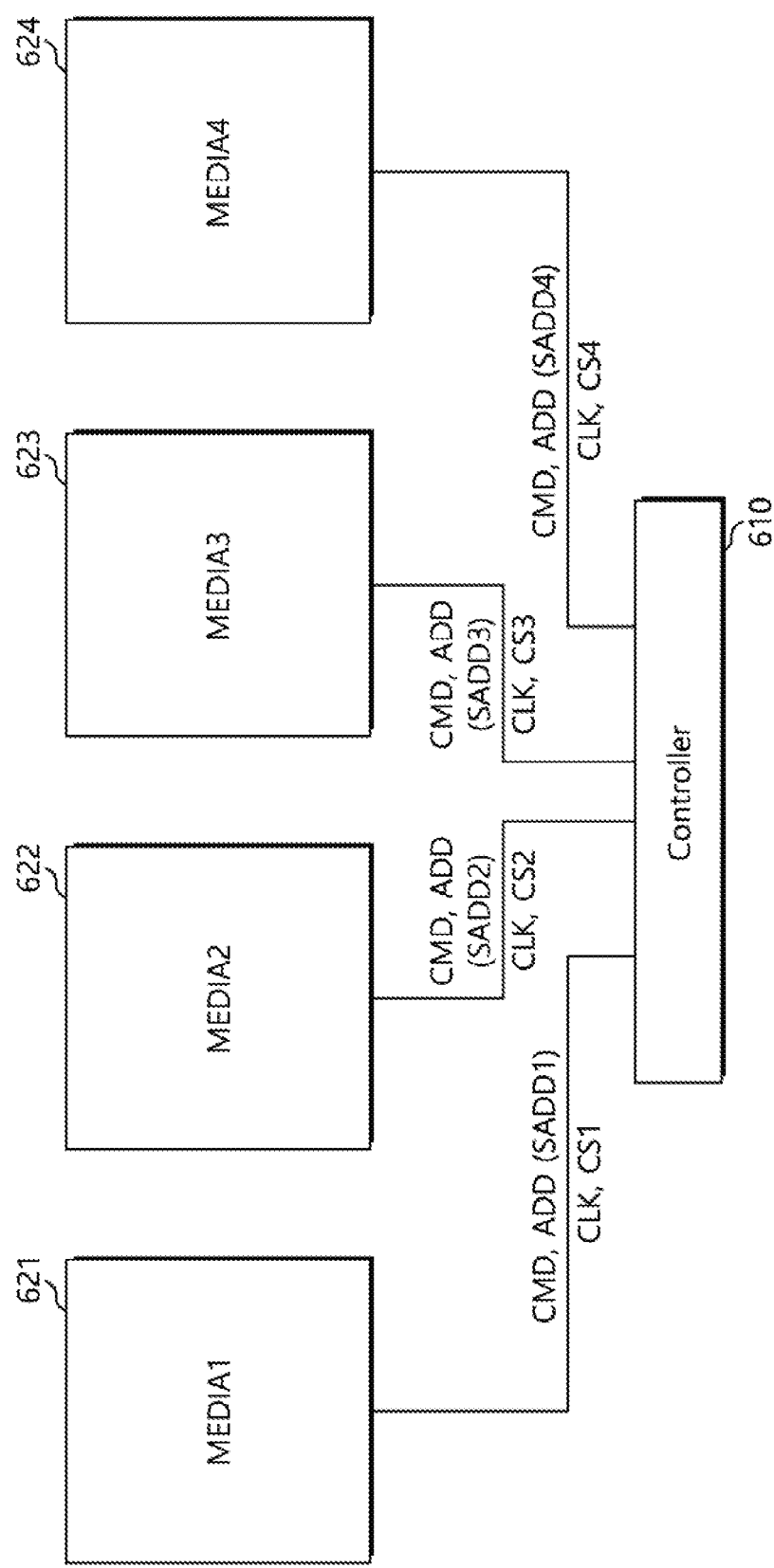
FIG. 6 is a diagram, illustrating a configuration of a memory system, in accordance with an embodiment.

FIG. 6 illustrates a configuration of a memory system 600 in accordance with an embodiment. The memory system 600 may include a controller 610 and a plurality of media. FIG. 6 illustrates that the memory system 600 includes four media, but the number of media included in the memory system 600 may be smaller or larger than four. The controller 610 may perform write and read operations through communication with a first medium 621, a second medium 622, a third medium 623 and a fourth medium 624. The controller 610 may provide various control signals such that the first to fourth media 621 to 624 can perform various operations. The controller 610 may enable some or all of first to fourth chip select signals CS1 to CS4 allocated to the first to fourth media 621 to 624, respectively, such that some or all of the first to fourth media 621 to 624 can perform a write or read operation. The controller 610 may provide a command signal CMD and a clock signal CLK to the first to fourth media 621 to 624 in common. In an embodiment, the controller 610 may provide an address signal ADD to the first to fourth media 621 to 624 in common. The nonvolatile memory apparatus 300 illustrated in FIG. 3 may be applied as each of the first to fourth media 621 to 624. When the first to fourth media 621 to 624 perform a read operation based on the command signal CMD, the number of cell arrays where the first read operation is performed can be minimized. Thus, the power consumption of the memory system 600 can be minimized while read disturbance is reduced.

In an embodiment, the controller 610 may provide different address signals to the first to fourth media 621 to 624, instead of providing the address signal ADD to the first to fourth media 621 to 624 in common. For example, the controller 610 may include the address control circuit illustrated in FIG. 4, and generate first to fourth scrambled address signals SADD1 to SADD4 by scrambling the address signal ADD through different methods. The controller 610 may provide the first scrambled address signal SADD1 to the first medium 621, provide the second scrambled address signal SADD2 to the second medium 622, provide the third scrambled address signal SADD3 to the third medium 623, and provide the fourth scrambled address signal SADD4 to the fourth medium 624. Therefore, the controller 610 may provide different scrambled address signals to the first to fourth media 621 to 624, such that when a memory cell included in the near area of the cell array of at least one medium among the first to fourth media 621 to 624 is selected, memory cells included in the far areas of the cell arrays of the other media can be selected. In an embodiment, when the controller 610 scrambles a specific address signal through the first method to select a memory cell included in the near area of the cell array of the first medium 621, the controller 610 may scramble the specific address signal through the second method to select a memory cell included in a first area of the cell array of the second medium 622. The first area may be a far area close to the near area. The controller 610 may scramble the specific address signal through the third method to select a memory cell included in a second area of the cell array of the third medium 623. The second area may be a far area remote from the near area, and the distance from the near area to the second area may be larger than the distance from the near area to the first area. The controller 610 may scramble the specific address signal through the fourth method to select a memory cell included in a third area of the cell array of the fourth medium 624. The third area may be the far area which is the remotest from the near area, and the distance from the near area to the third area may be larger than the distance from the near area to the second area.

In an embodiment, the first to fourth media 621 to 624 may be included in one module, and the controller 610 may an external device disposed outside the module. In an embodiment, the first to fourth media 621 to 624 and the controller 610 may be merged into one module and/or system.

Figure 7:
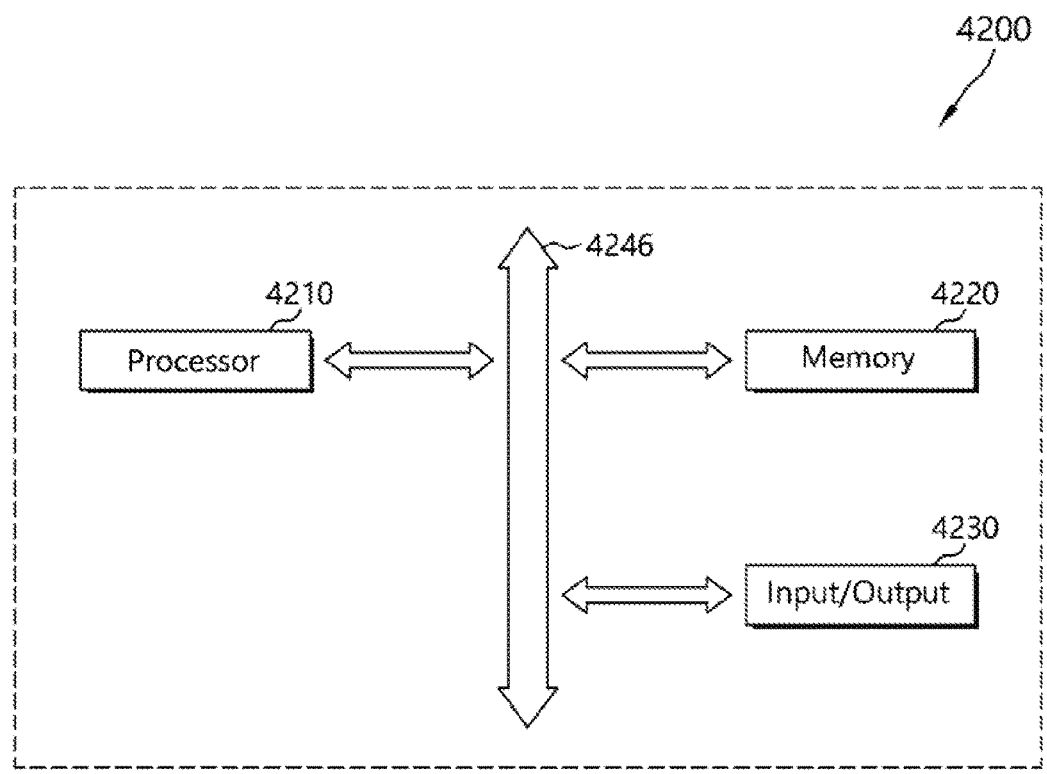
FIG. 7 illustrates a block diagram to assist in the explanation of an electronic apparatus, including a semiconductor memory apparatus in accordance with an embodiment.

FIG. 7 illustrates a block diagram to assist in the explanation of an electronic apparatus, including a semiconductor memory apparatuses, in accordance with some embodiments. Referring to FIG. 7, an electronic apparatus 4200 may include a processor 4210, a memory 4220, and an input and output device 4230. The processor 4210, the memory 4220, and the input and output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include at least one of the semiconductor nonvolatile memory apparatuses 100, 200, and 300, associated with FIG. 1, FIG. 2, and FIG. 3. In order for the configuration to function properly, additional circuits and control signals may be provided.

The electronic apparatus 4200 may configure various electronic control apparatuses, which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or any device, capable of transmitting and receiving information wirelessly.

Figure 8:
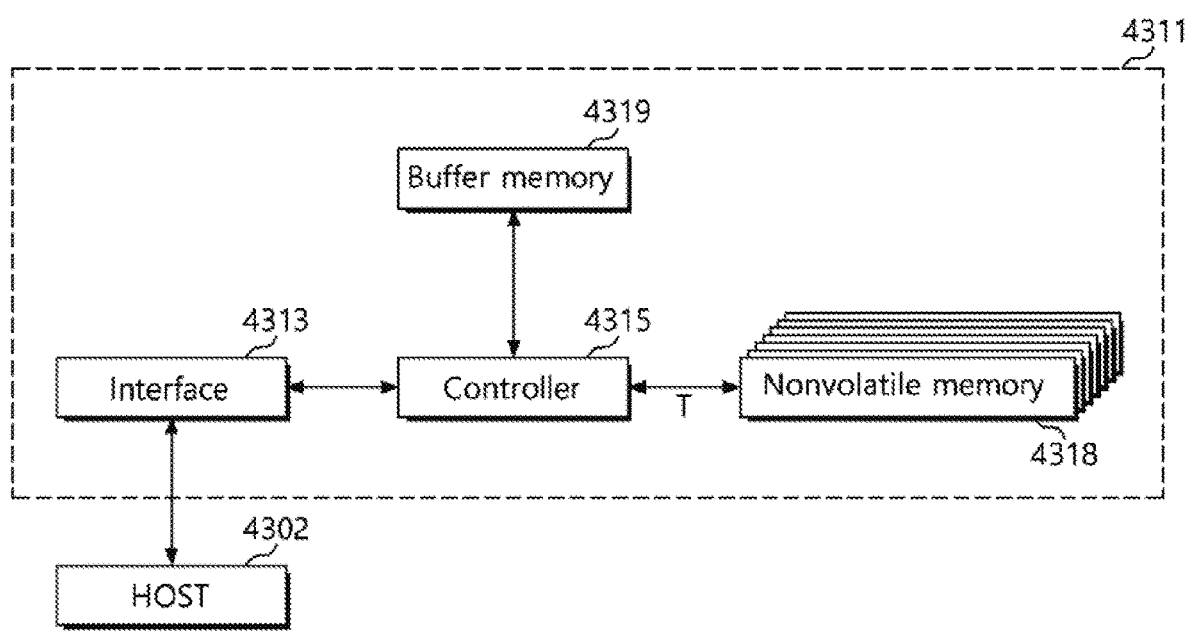
FIG. 8 illustrates a data storage device, including a semiconductor memory apparatus, in accordance with an embodiment.

The following descriptions refer to a modified example of the electronic apparatus 4200, with reference to FIG. 8.

FIG. 8 illustrates a data storage device, including a semiconductor memory apparatuses, in accordance with some embodiments. Referring to FIG. 8, a data storage device, such as a solid state disk (SSD) 4311, may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides an advantage of high speed. Additionally, a mechanical delay, a failure rate, heat generation, and noise generation all decrease. Further, miniaturization and light weight may be realized as compared to a hard disk drive (HDD). The solid state disk 4311 may be widely used in a notebook PC, a net book, a desktop PC, an MP3 player, or a portable storage device.

The controller 4315 may be formed adjacent to the interface 4313 and be electrically coupled to the interface 4313. The controller 4315 may be a microprocessor including a memory controller and a buffer controller. The nonvolatile memories 4318 may be formed adjacent to the controller 4315 and be electrically coupled to the controller 4315 via connection terminals T. The data storage capacity of the solid state disk 4311 may correspond to the nonvolatile memories 4318. The buffer memory 4319 may be formed adjacent to the controller 4315 and be electrically coupled to the controller 4315. Each of the nonvolatile memories 4220 may include at least one of the semiconductor memory apparatuses 100, 200, and 300 associated with FIG. 1, FIG. 2, and FIG. 3.

The interface 4313 may be coupled to a host 4302 and play the role of transmitting and receiving electrical signals such as data. For example, the interface 4313 may be a device which uses the same protocol as SATA, IDE, SCSI, and/or a combination thereof. The nonvolatile memories 4318 may be coupled to the interface 4313 via the controller 4315.

The nonvolatile memories 4318 may play the role of storing the data received through the interface 4313. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include at least one of the semiconductor memory apparatuses 100, 200, and 300 associated with FIG. 1, FIG. 2, and FIG. 3.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

While certain embodiments have been described above, it will be understood by those skilled in the art that these embodiments represent only a limited number of possible examples. Accordingly, the nonvolatile memory apparatus effectively performing a read operation and a system using the same should not be limited based on the described embodiments. Rather, the nonvolatile memory apparatus effectively performing a read operation and a system using the same described herein should only be limited in light of the claims that follow when taken in conjunction with the above description and accompanying drawings.

What is claimed is:

1. A nonvolatile memory apparatus comprising:
   a first cell array including a near area and a far area; and
   a second cell array including a near area and a far area,
   wherein, when selecting a memory cell included in the near area of one of the two cell arrays based on an address signal, the nonvolatile memory apparatus selects a memory cell included in the far area of the remaining cell array based on the address signal,
   wherein the nonvolatile memory apparatus performs a first read operation on the memory cell, included in the near area of the one of the two cell arrays, and performs a second read operation on the memory cell, included in the far area of the remaining cell array, and
   wherein the first read operation is performed for a longer period of time than the second read operation.

2. The nonvolatile memory apparatus according to claim 1, wherein data, read from the first cell array, is outputted through a first data transmission line, and data, read from the second cell array, is outputted through a second data transmission line.

3. The nonvolatile memory apparatus according to claim 1, further comprising:
   a first read control circuit configured to output one of a first read pulse signal and a second read pulse signal based on a read signal and the address signal;
   a first read circuit configured to perform a read operation on the first cell array based on the output of the first read control circuit;
   a second read control circuit configured to output one of the first and second read pulse signals based on the read signal and the address signal; and
   a second read circuit configured to perform a read operation on the second cell array based on the output of the second read control circuit.

4. The nonvolatile memory apparatus according to claim 3, wherein the first read pulse signal is enabled for a longer period of time than the second read pulse signal.

5. The nonvolatile memory apparatus according to claim 3, wherein the first read control circuit comprises:
   a first address control circuit configured to scramble the address signal through a first method;
   a first flag generation circuit configured to generate a first flag signal based on a first scrambled address signal, generated through the first address control circuit;
   a pulse generation circuit configured to generate the first and second read pulse signals based on the read signal; and
   a first pulse selection circuit configured to output one of the first and second read pulse signals based on the first flag signal.

6. The nonvolatile memory apparatus according to claim 5, wherein the second read control circuit comprises:
   a second address control circuit configured to scramble the address signal through a second method;
   a second flag generation circuit configured to generate a second flag signal based on a second scrambled address signal generated through the second address control circuit; and
   a second pulse selection circuit configured to output one of the first and second read pulse signals based on the second flag signal.

7. The nonvolatile memory apparatus according to claim 3, wherein the first read circuit comprises:
   a voltage supply circuit configured to provide a first read voltage to a selected memory cell based on one of the first and second read pulse signals;
   a first current supply circuit configured to apply a second read voltage and a first current to the selected memory cell based on the first read pulse signal;
   a second current supply circuit configured to apply the second read voltage and a second current to the selected memory cell based on the second read pulse signal; and
   a sense amplifier configured to generate a first data output signal by sensing whether snapback of the selected memory cell occurs.

8. The nonvolatile memory apparatus according to claim 3, wherein the second read circuit comprises:
   a voltage supply circuit configured to provide a first read voltage to a selected memory cell based on one of the first and second read pulse signals;
   a first current supply circuit configured to apply a second read voltage and a first current to the selected memory cell based on the first read pulse signal;
   a second current supply circuit configured to apply the second read voltage and a second current to the selected memory cell based on the second read pulse signal; and
   a sense amplifier configured to generate a second data output signal by sensing whether snapback of the selected memory cell occurs.

9. A nonvolatile memory apparatus comprising:
   a first cell array;
   a first read control circuit configured to receive an address signal, generate a first scrambled address signal, by scrambling the address signal through a first method, and output one of a first read pulse signal and a second read pulse signal based on the first scrambled address signal;
   a first read circuit configured to perform a read operation on the first cell array based on the output of the first read control circuit;
   a second cell array;
   a second read control circuit configured to receive the address signal, generate a second scrambled address signal by scrambling the address signal through a second method, different from the first method, and output one of the first and second read pulse signals based on the second scrambled address signal; and
   a second read circuit configured to perform a read operation on the second cell array based on the output of the second read control circuit.

10. The nonvolatile memory apparatus according to claim 9, wherein when a memory cell included in a near area of the first cell array is selected based on the first scrambled address signal, a memory cell included in a far area of the second cell array is selected based on the second scrambled address signal.

11. The nonvolatile memory apparatus according to claim 9, wherein the first read control circuit outputs the first read pulse signal when the first scrambled address signal has information to select a memory cell included in a near area of the first cell array, and outputs the second read pulse signal which is enabled for a shorter time than the first read pulse signal when the first scrambled address signal has information to select a memory cell included in a far area of the first cell array,
   wherein the first read pulse signal is enabled for a longer period of time than the second read pulse signal.

12. The nonvolatile memory apparatus according to claim 11, wherein the second read control circuit outputs the first read pulse signal when the second scrambled address signal has information to select a memory cell, included in a near area of the second cell array, and outputs the second read pulse signal when the second scrambled address signal has information to select a memory cell, included in a far area of the second cell array.

13. The nonvolatile memory apparatus according to claim 11, wherein the first read control circuit comprises:
   a first address control circuit configured to generate the first scrambled address signal by scrambling the address signal through the first method;
   a first flag generation circuit configured to generate a first flag signal based on the first scrambled address signal;
   a pulse generation circuit configured to generate the first read pulse signal and the second read pulse signal based on a read signal; and
   a first pulse selection circuit configured to output one of the first and second read pulse signals based on the first flag signal.

14. The nonvolatile memory apparatus according to claim 13, wherein the second read control circuit comprises:

a second address control circuit configured to generate the second scrambled address signal by scrambling the address signal through the second method;
a second flag generation circuit configured to generate a second flag signal based on the second scrambled address signal; and
a second pulse selection circuit configured to output one of the first and second read pulse signals based on the second flag signal.

15. The nonvolatile memory apparatus according to claim 9, wherein the first read circuit comprises:
a voltage supply circuit configured to provide a first read voltage to a selected memory cell based on one of the first and second read pulse signals;
a first current supply circuit configured to apply a second read voltage and a first current to the selected memory cell based on the first read pulse signal;
a second current supply circuit configured to apply the second read voltage and a second current to the selected memory cell based on the second read pulse signal; and
a sense amplifier configured to generate an output signal by sensing whether snapback of the selected memory cell occurs.

16. The nonvolatile memory apparatus according to claim 9, wherein the second read circuit comprises:
a voltage supply circuit configured to provide a first read voltage to a selected memory cell based on one of the first and second read pulse signals;
a first current supply circuit configured to apply a second read voltage and a first current to the selected memory cell based on the first read pulse signal;
a second current supply circuit configured to apply the second read voltage and a second current to the selected memory cell based on the second read pulse signal; and
a sense amplifier configured to generate an output signal by sensing whether snapback of the selected memory cell occurs.

17. A nonvolatile memory apparatus comprising:
a plurality of cell arrays, each including a near area and a far area;
a plurality of memory cells, included in the near area, and a plurality of memory cells, included in the far area;
wherein, when a memory cell of the plurality of memory cells, included in a near area, of at least one cell array, among the plurality of cell arrays, is selected, based on an address signal, the nonvolatile memory apparatus selects memory cells included in far areas of the remaining cell arrays based on the address signal,
wherein the nonvolatile memory apparatus performs a first read operation on the selected memory cell of the at least one cell array, and performs a second read operation on the selected memory cells of the remaining cell arrays, and
wherein the first read operation is performed for a longer period of time than the second read operation.

18. The nonvolatile memory apparatus according to claim 17, wherein the nonvolatile memory apparatus generates a plurality of scrambled address signals, by scrambling the address signal through different methods, and selects memory cells of the plurality of cell arrays based on the respective scrambled address signals.

19. The nonvolatile memory apparatus according to claim 18, wherein the nonvolatile memory apparatus applies a read voltage to a selected memory cell during the first and second read operations, and
wherein the nonvolatile memory apparatus applies a first current to the selected memory cell during the first read operation, and applies a second current smaller than the first current to the selected memory cell during the second read operation.

20. The nonvolatile memory apparatus according to claim 19, wherein the first current has an amount, corresponding to an anneal current, to set the resistance state of the selected memory cell to a low resistance state.

21. A nonvolatile memory apparatus comprising:
a plurality of cell arrays, each including a near area and a far area;
a plurality of memory cells, included in the near area, and a plurality of memory cells, included in the far area;
wherein the nonvolatile memory apparatus generates a plurality of scrambled address signals, by scrambling an address signal through different methods, and selects memory cells of the plurality of cell arrays based on the respective scrambled address signals, such that when a memory cell of the plurality of memory cells, included in a near area, of at least one cell array, among the plurality of cell arrays, is selected, the nonvolatile memory apparatus selects memory cells included in far areas of the remaining cell arrays,
wherein the nonvolatile memory apparatus performs a first read operation on the selected memory cell of the at least one cell array, and performs a second read operation on the selected memory cells of the remaining cell arrays.

22. The nonvolatile memory apparatus according to claim 21, wherein the nonvolatile memory apparatus applies a read voltage to a selected memory cell during the first and second read operations, and
wherein the nonvolatile memory apparatus applies a first current to the selected memory cell during the first read operation, and applies a second current smaller than the first current to the selected memory cell during the second read operation.

23. The nonvolatile memory apparatus according to claim 22, wherein the first current has an amount, corresponding to an anneal current, to set the resistance state of the selected memory cell to a low resistance state.

24. The nonvolatile memory apparatus according to claim 22, wherein the first read operation is performed for a longer period of time than the second read operation.

* * * * *